United States Patent
Cruickshank et al.

(10) Patent No.: US 8,696,925 B2
(45) Date of Patent: Apr. 15, 2014

(54) EFFECTIVE SUBSTITUTIONS FOR RARE EARTH METALS IN COMPOSITIONS AND MATERIALS FOR ELECTRONIC APPLICATIONS

(75) Inventors: David Bowie Cruickshank, Rockville, MD (US); Michael D. Hill, Frederick, MD (US)

(73) Assignee: Skyworks Solutions, Inc., Woburn, MA (US)

(*) Notice: Subject to any disclaimer, the term of this patent is extended or adjusted under 35 U.S.C. 154(b) by 174 days.

(21) Appl. No.: 13/183,329

(22) Filed: Jul. 14, 2011

(65) Prior Publication Data
US 2012/0133452 A1    May 31, 2012

Related U.S. Application Data

(60) Provisional application No. 61/493,942, filed on Jun. 6, 2011, provisional application No. 61/418,383, filed on Nov. 30, 2010.

(51) Int. Cl.
*C04B 35/40* (2006.01)

(52) U.S. Cl.
USPC ........ 252/62.57; 501/152; 501/126; 501/102; 252/62.59; 252/62.63

(58) Field of Classification Search
USPC ......... 252/62.57, 62.59, 62.63; 501/152, 126, 501/102
See application file for complete search history.

(56) References Cited

U.S. PATENT DOCUMENTS

| | | | | |
|---|---|---|---|---|
| 3,268,452 | A * | 8/1966 | Geller | 252/62.63 |
| 3,688,282 | A * | 8/1972 | Buhrer | 365/10 |
| 3,838,450 | A * | 9/1974 | Bongers et al. | 360/59 |
| 5,709,811 | A | 1/1998 | Satoh | |
| 2009/0260861 | A1 | 10/2009 | Nakajima | |

FOREIGN PATENT DOCUMENTS

JP    2002-064013    2/2002

OTHER PUBLICATIONS

International Search Report and Written Opinion from corresponding PCT/US1011/061733.

* cited by examiner

*Primary Examiner* — Carol M Koslow
(74) *Attorney, Agent, or Firm* — Knobee Martens Olson & Bear, LLP

(57) ABSTRACT

Embodiments disclosed herein include methods of modifying synthetic garnets used in RF applications to reduce or eliminate Yttrium or other rare earth metals in the garnets without adversely affecting the magnetic properties of the material. Some embodiments include substituting Bismuth for some of the Yttrium on the dodecahedral sites and introducing one or more high valency ions to the octahedral and tetrahedral sites. Calcium may also be added to the dodecahedral sites for valency compensation induced by the high valency ions, which could effectively displace all or most of the Yttrium (Y) in microwave device garnets. The modified synthetic garnets with substituted Yttrium (Y) can be used in various microwave magnetic devices such as circulators, isolators and resonators.

10 Claims, 10 Drawing Sheets $Y_{2.15-2x} Bi_{0.5} Ca_{0.35+2x} Zr_{0.35} V_x Fe_{4.65-x} O_{12}$

EFFECTIVE SUBSTITUTIONS FOR RARE EARTH METALS IN COMPOSITIONS AND MATERIALS FOR ELECTRONIC APPLICATIONS

CROSS-REFERENCE TO RELATED APPLICATIONS

This application claims the benefit of priority under 35 U.S.C. §119(e) of U.S. Provisional Application No. 61/418,383 filed on Nov. 30, 2010 and U.S. Provisional Application No. 61/493,942 filed on Jun. 6, 2011. Each of the application is incorporated herein by reference in its entirety.

BACKGROUND OF THE INVENTION

1. Field of the Invention

The present application generally relates to synthetic garnet compositions and methods of making the same. The present application also relates to radio frequency (RF) devices and systems including said compositions.

2. Description of the Related Art

Various crystalline materials with magnetic properties have been used as components in electronic devices such as cellular phones, biomedical devices, and RFID sensors. Garnets are crystalline materials with ferrimagnetic properties particularly useful in RF electronics operating in the lower frequency portions of the microwave region. Many microwave magnetic materials are derivatives of Yttrium Iron Garnet (YIG), a synthetic form of garnet widely used in various telecommunication devices largely because of its favorable magnetic properties such as narrow line absorption at its ferromagnetic resonance frequency. YIG is generally composed of Yttrium, Iron, Oxygen, and possibly doped with one or more other rare earth metals such as the Lanthanides or Scandium. However, the supply of rare earth elements such as Yttrium has recently become increasingly restricted, thus resulting in correspondingly steep increases in cost. As such, there is a need to find a cost-effective substitute for rare earth elements in synthetic garnet structures that does not compromise the magnetic properties of the material and can be used for microwave applications.

SUMMARY

The compositions, materials, methods of preparation, devices, and systems of this disclosure each have several aspects, no single one of which is solely responsible for its desirable attributes. Without limiting the scope of this invention, its more prominent features will now be discussed briefly.

Any terms not directly defined herein shall be understood to have all of the meanings commonly associated with them as understood within the art. Certain terms are discussed below, or elsewhere in the specification, to provide additional guidance to the practitioner in describing the compositions, methods, systems, and the like of various embodiments, and how to make or use them. It will be appreciated that the same thing may be said in more than one way. Consequently, alternative language and synonyms may be used for any one or more of the terms discussed herein. No significance is to be placed upon whether or not a term is elaborated or discussed herein. Some synonyms or substitutable methods, materials and the like are provided. Recital of one or a few synonyms or equivalents does not exclude use of other synonyms or equivalents, unless it is explicitly stated. Use of examples in the specification, including examples of terms, is for illustrative purposes only and does not limit the scope and meaning of the embodiments herein.

Embodiments disclosed herein include methods for modifying synthetic garnets used in RF applications to reduce or eliminate Yttrium (Y) or other rare earth metals in the garnets without adversely affecting the magnetic properties of the material. In some embodiments, modified synthetic garnet compositions with significantly reduced rare earth content are designed with properties suitable for use as ferrite materials in devices such as isolators and circulators, which are necessary components in all cellular base stations.

Some embodiments include methods of substituting at least some of the Yttrium (Y) in a garnet structure with other chemicals, such as a combination of Bismuth and one or more high valency ions. The substitute chemicals are selected to reduce the content of Y without adversely affecting the performance of the material. The rare earth substitutions described herein substantially reduce the need for Yttrium Oxides in the synthesis of certain garnet structures such as Yttrium Iron Garnets (YIG), and provide modified crystalline materials useful in a variety of electronic applications including but not limited to uses in devices for cellular base stations.

In one embodiment, the method for modifying synthetic garnets comprises substituting Bismuth (Bi) for some of the Yttrium (Y) on the dodecahedral sites of the garnet structure and introducing high valency non-magnetic ions, preferably greater than +3, to the octahedral sites to replace some of the Iron (Fe) in the garnet. The quantity and combination of substitute ions and processing techniques are selected to ensure that the resulting material has high magnetization with low linewidth, along with reduced Yttrium (Y) content. In some embodiments, Calcium (Ca) is also introduced to the dodecahedral sites of the garnet structure for charge compensation induced by the high valency ions while at the same time replace some or all of the remaining Yttrium (Y). In some other embodiments, the method further comprises introducing one or more high valency ions, such as Vanadium ($V^{5+}$), to the tetrahedral sites of the garnet structure to further reduce the saturation magnetization of the resulting material.

In one implementation, the modified synthetic crystalline material is represented by the formula $Bi_xCa_{y+2z}Y_{3-x-y-2z}Fe_{5-y-z}Zr_yV_zO_{12}$, wherein x is greater than or equal to 0.5 and less than or equal to 1.4, y is greater than or equal to 0.3 and less than or equal to 0.55, and z is greater than or equal to 0 or less than or equal to 0.6. Bi and Ca are placed on the dodecahedral sites, Zr is placed on the octahedral sites, and V is placed on the tetrahedral sites. In some versions, small amounts of Niobium (Nb) may be placed on the octahedral site and small amounts of Molybdenum (Mo) on the tetrahedral site. Preferably, the modified crystalline material has a magnetic resonance linewidth of less than or equal to 11 Oersted.

In another embodiment, the modified synthetic crystalline material is represented by the formula $Bi(Y,Ca)_2Fe_{4.2}M^I_{0.4}M^{II}_{0.4}O_{12}$, where $M^I$ is the octahedral substitution for Fe and can be selected from the group consisting of In, Zn, Mg, Zr, Sn, Ta, Nb, Fe, Ti, Sb, and combinations thereof where $M^{II}$ is the tetrahedral substitution for Fe and can be selected from the group consisting of: Ga, W, Mo, Ge, V, Si, and combinations thereof.

In yet another implementation, the modified synthetic crystalline material is represented by the formula $Bi_{0.9}Ca_{0.9x}Y_{2.1-0.9x}(Zr_{0.7}Nb_{0.1})_xFe_{5-0.8x}O_{12}$, wherein x is greater than or equal to 0.5 and less than or equal to 1.0.

In yet another implementation, the modified synthetic crystalline material is represented by the formula $Bi_x$ $Y_{3-x-0.35}Ca_{0.35}Zr_{0.35}Fe_{4.65}O_{12}$, where x is greater than or equal to 0.5 and less than or equal to 1.0, more preferably x is greater or equal to 0.6 and less than or equal to 0.8.

In yet another implementation, the modified synthetic crystalline material is represented by the formula $Y_{2.15-2x}Bi_{0.5}Ca_{0.35+2x}Zr_{0.35}V_xFe_{4.65-x}O_{12}$, wherein x is greater than or equal to 0.1 and less than or equal to 0.8.

In yet another implementation, a modified Yttrium based garnet structure is provided. The modified Yttrium based garnet structure comprises Bismuth ($Bi^{3+}$) and Calcium ($Ca^{2+}$) doped dodecahedral sites, and tetravalent or pentavalent ion doped octahedral sites, wherein $Bi^{3+}$ occupies about 0 to 100 atomic percent of the dodecahedral sites, $Ca^{2+}$ occupies about 0 to 90 atomic percent of the dodecahedral sites, wherein the tetravalent or pentavalent ions occupy about 0 to 50 atomic percent of the octahedral sites, wherein said modified synthetic Yttrium based garnet structure has a magnetic resonance linewidth of between 0 and 50 Oersteds. In some implementations, the modified Yttrium based garnet structure further comprises Vanadium ($V^{5+}$) doped tetrahedral sites, wherein $V^{5+}$ occupies about 0 to 50 atomic percent of the tetrahedral sites. Preferably, Yttrium occupies the balance of the dodecahedral sites of the modified Yttrium based garnet structure. In some implementations, the modified Yttrium based garnet structure is incorporated as a ferrite material in RF devices such isolators, circulators, or resonators.

Advantageously, the substitution allows the use of tetravalent, pentavalent, and other ions on the octahedral site of the garnet structure, resulting in potentially high magnetization with low linewidth, along with reduced Y content.

DETAILED DESCRIPTION OF THE PREFERRED EMBODIMENT

Disclosed herein are methods of modifying synthetic garnet compositions, such as Yttrium Iron Garnet (YIG), to reduce or eliminate the use of rare earth metals in such compositions. Also disclosed herein are synthetic garnet materials having reduced or no rare earth metal content, methods of producing the materials, and the devices and systems incorporating such materials. The synthetic garnet materials prepared according to embodiments described in the disclosure exhibit favorable magnetic properties for microwave magnetic applications. These favorable properties include but are limited to low magnetic resonance line width, optimized density, saturation magnetization and dielectric loss tangent. Applicants have surprisingly found that when garnet compositions are doped with certain combinations of ions and prepared using certain processing techniques, a significant amount if not all of the rare earth elements can be substituted and yet still result in microwave magnetic crystalline materials with comparable, if not superior, performance characteristics as commercially available garnets containing Yttrium (Y) or other rare earth elements.

Figure 1:
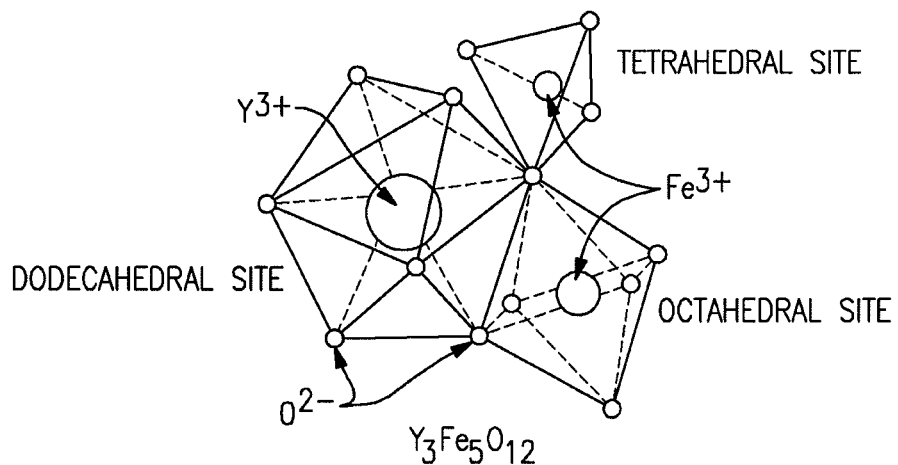
FIG. 1 depicts a Yttrium based garnet crystal lattice structure.

Synthetic garnets typically have the formula unit of $A_3B_5O_{12}$, where A and B are trivalent metal ions. Yttrium Iron Garnet (YIG) is a synthetic garnet having the formula unit of $Y_3Fe_5O_{12}$, which includes Yttrium (Y) in the 3+ oxidation state and Iron (Fe) in the 3+ oxidation state. The crystal structure of a YIG formula unit is depicted in FIG. 1. As shown in FIG. 1, YIG has a dodecahederal site, an octahedral site, and a tetrahedral site. The Y ions occupy the dodecahedral site while the Fe ions occupy the octahedral and tetrahedral sites. Each YIG unit cell, which is cubic in crystal classifications, has eight of these formula units.

The modified synthetic garnet compositions, in some embodiments, comprise substituting some or all of the Yttrium (Y) in Yttrium Iron Garnets (YIG) with a combination of other ions such that the resulting material maintains desirable magnetic properties for microwave applications. There have been past attempts toward doping YIG with different ions to modify the material properties. Some of these attempts, such as Bismuth (Bi) doped YIG, are described in "Microwave Materials for Wireless Applications" by D. B. Cruickshank, which is hereby incorporated by reference in its entirety. However, in practice ions used as substitutes may not behave predictably because of, for example, spin canting induced by the magnetic ion itself or by the effect of nonmagnetic ions on the environment adjacent magnetic ions, reducing the degree alignment. Thus, the resulting magnetic properties cannot be predicted. Additionally, the amount of substitution is limited in some cases. Beyond a certain limit, the ion will not enter its preferred lattice site and either remains on the outside in a second phase compound or leaks into another site. Additionally, ion size and crystallographic orientation preferences may compete at high substitution levels, or substituting ions are influenced by the ion size and coordination of ions on other sites. As such, the assumption that the net magnetic behavior is the sum of independent sub-lattices or single ion anisotropy may not always apply in predicting magnetic properties.

Considerations in selecting an effective substitution of rare earth metals in YIG for microwave magnetic applications include the optimization of the density, the magnetic resonance linewidth, the saturation magnetization, the Curie temperature, and the dielectric loss tangent in the resulting modified crystal structure. Magnetic resonance is derived from spinning electrons, which when excited by an appropriate radio frequency (RF) will show resonance proportional to an applied magnetic field and the frequency. The width of the resonance peak is usually defined at the half power points and is referred to as the magnetic resonance linewidth. It is generally desirable for the material to have a low linewidth because low linewidth manifests itself as low magnetic loss, which is required for all low insertion loss ferrite devices. The modified garnet compositions according to preferred embodiments of the present invention provide single crystal or polycrystalline materials with reduced Yttrium content and yet maintaining low linewidth and other desirable properties for microwave magnetic applications.

In some embodiments, a Yttrium based garnet is modified by substituting Bismuth ($Bi^{3+}$) for some of the Yttrium ($Y^{3+}$) on the dodecahedral sites of the garnet structure in combination with introducing one or more ions, such as divalent (+2), trivalent (+3), tetravalent (+4), pentavalent (+5) or hexavalent (+6) non-magnetic ions to the octahedral sites of the structure to replace at least some of the Iron ($Fe^{3+}$). In a preferred implementation, one or more high valency non-magnetic ions such as Zirconium ($Zr^{4+}$) or Niobium ($Nb^{5+}$) can be introduced to the octahedral sites.

In some embodiments, a Yttrium based garnet is modified by introducing one or more high valency ions with an oxidation state greater than 3+ to the octahedral or tetrahedral sites of the garnet structure in combination with substituting Calcium ($Ca^{2+}$) for Yttrium ($Y^{3+}$) in the dodecahedral site of the structure for charge compensation induced by the high valency ions, hence reducing the $Y^{3+}$ content. When non-trivalent ions are introduced, valency balance is maintained by introducing, for example, divalent Calcium ($Ca^{2+}$) to balance the non-trivalent ions. For example, for each 4+ ion introduced to the octahedral or tetrahedral sites, one $Y^{3+}$ ion is substituted with a $Ca^{2+}$ ion. For each 5+ ion, two $Y^{3+}$ ions are replaced by $Ca^{2+}$ ions. For each 6+ ion, three $Y^{3+}$ ions are replaced by $Ca^{2+}$ ions. For each 6+ ion, three $Y^{3+}$ ions are replaced by $Ca^{2+}$ ions. In one implementation, one or more high valence ions selected from the group consisting of $Zr^{4+}$, $Sn^{4+}$, $Ti^{4+}$, $Nb^{5+}$, $Ta^{5+}$, $Sb^{5+}$, $W^{6+}$, and $Mo^{6+}$ is introduced to the octahedral or tetrahedral sites, and divalent Calcium ($Ca^{2+}$) is used to balance the charges, which in turn reduces $Y^{3+}$ content.

In some embodiments, a Yttrium based garnet is modified by introducing one or more high valency ions, such as Vanadium ($V^{5+}$), to the tetrahedral site of the garnet structure to substitute for $Fe^{3+}$ to further reduce the magnetic resonance linewidth of the resulting material. Without being bound by any theory, it is believed that the mechanism of ion substitution causes reduced magnetization of the tetrahedral site of the lattice, which results in higher net magnetization of the garnet, and by changing the magnetocrystalline environment of the ferric ions also reduces anisotropy and hence the ferromagnetic linewidth of the material.

In some embodiments, Applicant has found that a combination of high Bismuth (Bi) doping combined with Vanadium (V) and Zirconium (Zr) induced Calcium (Ca) valency compensation could effectively displace all or most of the Yttrium (Y) in microwave device garnets. Applicants also have found that certain other high valency ions could also be used on the tetrahedral or octahedral sites and that a fairly high level of octahedral substitution in the garnet structure is preferred in order to obtain magnetic resonance linewidth in the 5 to 20 Oersted range. Moreover, Yttrium displacement is preferably accomplished by adding Calcium in addition to Bismuth to the dodecahedral site. Doping the octahedral or tetrahedral sites with higher valency ions, preferably greater than 3+, would allow more Calcium to be introduced to the dodecahedral site to compensate for the charges, which in turn would result in further reduction of Yttrium content.

Modified Synthetic Garnet Compositions

In one implementation, the modified synthetic garnet composition may be represented by general Formula I: $Bi_xCa_{y+2z}Y_{3-x-y-2z}Fe_{5-y-z}Zr_yV_zO_{12}$, where x=0 to 3, y=0 to 1, and z=0 to 1.5, more preferably x=0.5 to 1.4, y=0.3 to 0.55, and z=0 to 0.6. In a preferred implementation, 0.5 to 1.4 formula units of Bismuth (Bi) is substituted for some of the Yttrium (Y) on the dodecahedral site, 0.3 to 0.55 formula units of Zirconium (Zr) is substituted for some of the Iron (Fe) on the octahedral site. In some embodiments, up to 0.6 formula units of Vanadium (V) is substituted for some of the Iron (Fe) on the tetrahedral site. Charge balance is achieved by Calcium (Ca) substituting for some or all of the remaining Yttrium (Y). In some other embodiments, small amounts of Niobium (Nb) may be placed on the octahedral site and small amounts of Molybdenum (Mo) may be placed on the tetrahedral site.

In another implementation, the modified synthetic garnet composition may be represented by general Formula II: $Bi_xY_{3-x-0.35}Ca_{0.35}Zr_{0.35}Fe_{4.65}O_{12}$, where x=0.5 to 1.0, preferably x=0.6 to 0.8, more preferably x=0.5. In this implementation, 0.5 to 1.0 formula units of Bismuth (Bi) is substituted for some of the Yttrium (Y) on the dodecahedral site and Zirconium (Zr) is substituted for some of the Iron (Fe) on the octahedral site. Calcium ($Ca^{2+}$) is added to the dodecahedral site to replace some of the remaining Y to balance the Zr charges. Bi content can be varied to achieve varying material properties while Zr is held fixed at Zr=0.35.

In another implementation, the modified garnet composition may be represented by general Formula III: $Bi(Y,Ca)_2Fe_{4.2}M^I_{0.4}M^{II}_{0.4}O_{12}$, where $M^I$ is the octahedral substitution for Fe and can be selected from one or more of the following elements: In, Zn, Mg, Zr, Sn, Ta, Nb, Fe, Ti, and Sb, where $M^{II}$ is the tetrahedral substitution for Fe and can be selected from one or more of the following elements: Ga, W, Mo, Ge, V, Si.

Figure 2:
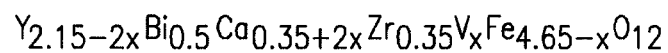
FIG. 2 is a graph depicting variations of material properties versus varying levels of Vanadium in crystalline compositions represented by the formula $Y_{2.15-2x}Bi_{0.5}Ca_{0.35+2x}Zr_{0.35}V_xFe_{4.65-x}O_{12}$, where x=0.1 to 0.8.
Figure 2:
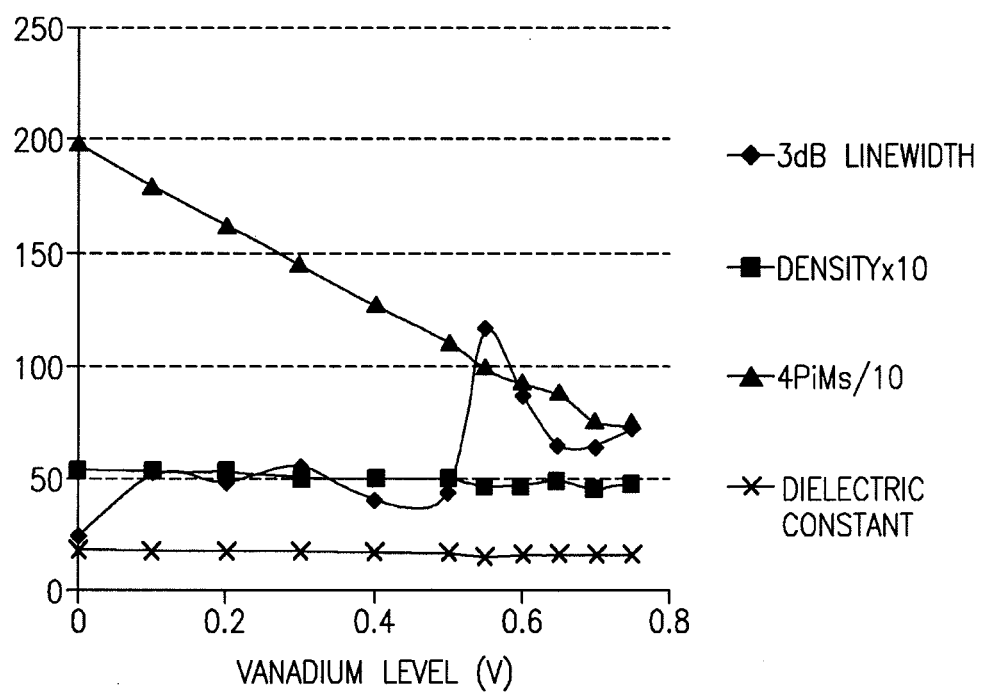

In another implementation, the modified synthetic garnet composition may be represented by general Formula IV: $Y_{2.15-2x}Bi_{0.5}Ca_{0.35+2x}Zr_{0.35}V_xFe_{4.65-x}O_{12}$, wherein x=0.1 to 0.8. In this implementation, 0.1 to 0.8 formula units of Vanadium (V) is added to the tetrahedral site to substitute for some of the Iron (Fe), and Calcium (Ca) is added to balance the V charges and replace some of the remaining Y while the levels of Bi and Zr remain fixed similar to Formula III. FIG. 2 illustrates variations of material properties in connection with varying levels of V. As shown in FIG. 2, the dielectric constant and density of the material remain largely constant with varying levels of V. Increasing levels of V reduces the 4PiMs by about 160 Gauss for each 0.1 of V. As further shown in FIG. 2, there are no appreciable changes in 3 dB linewidth up to V=0.5.

Figure 3:
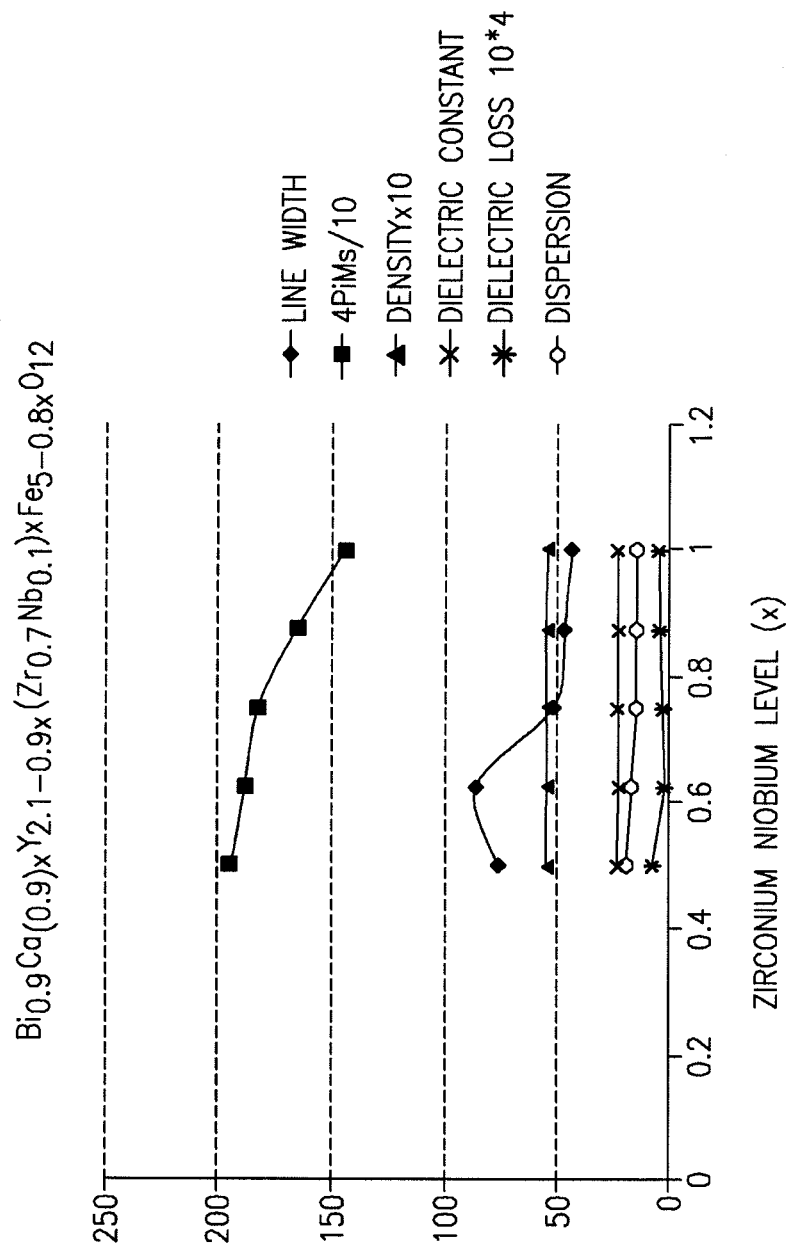
FIG. 3 is a graph depicting variations of material properties versus varying levels of (Zr, Nb) in crystalline compositions represented by the formula $Bi_{0.9}Ca_{0.9x}Y_{2.1-0.9x}(Zr_{0.7}Nb_{0.1})_xFe_{5-0.8x}O_{12}$, where x=0.5 to 1.0.
Figure 4A:
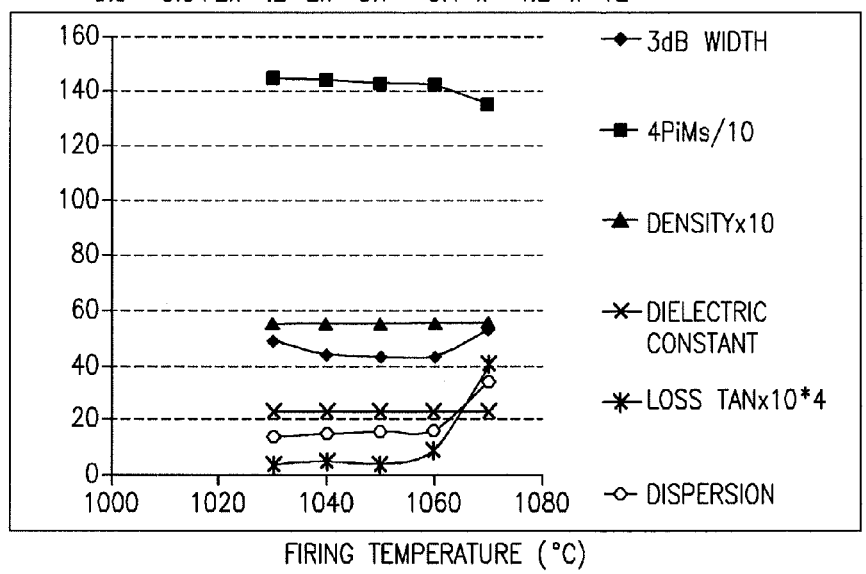
FIGS. 4A-4G are graphs depicting the relationship between firing temperature and various properties at varying levels of Vanadium in crystalline compositions represented by the formula $Bi_{0.9}Ca_{0.9+2x}Zr_{0.7}Nb_{0.1}V_xFe_{4.2-x}O_{12}$ where x=0-0.6.
Figure 4B:
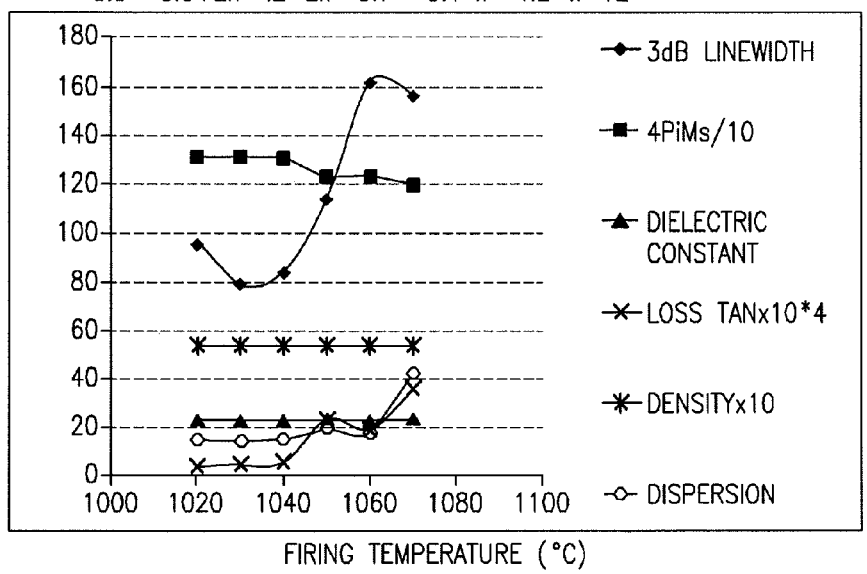
Figure 4C:
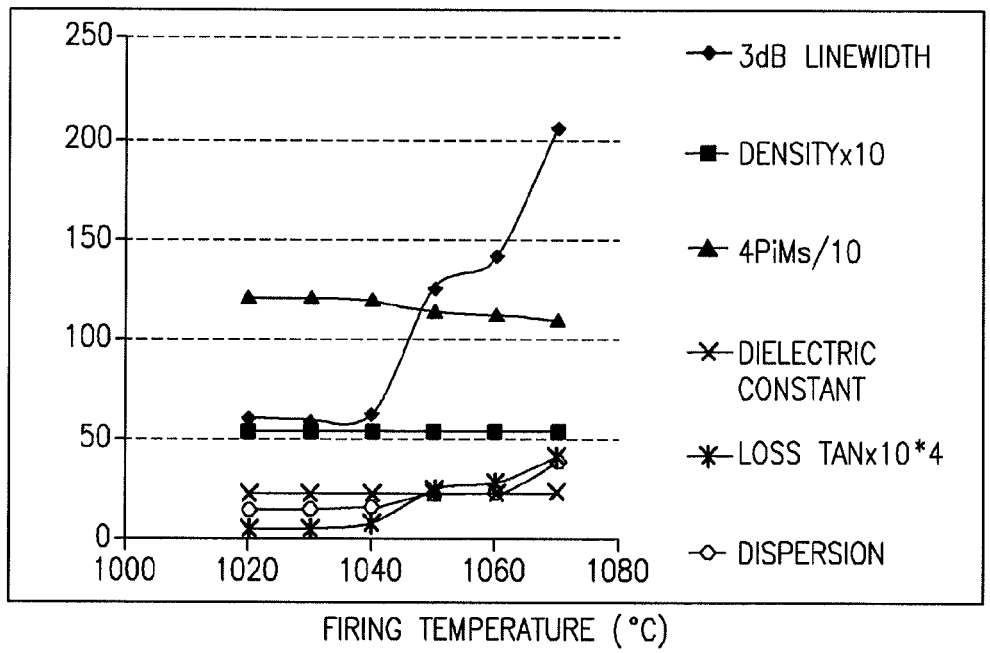
Figure 4D:
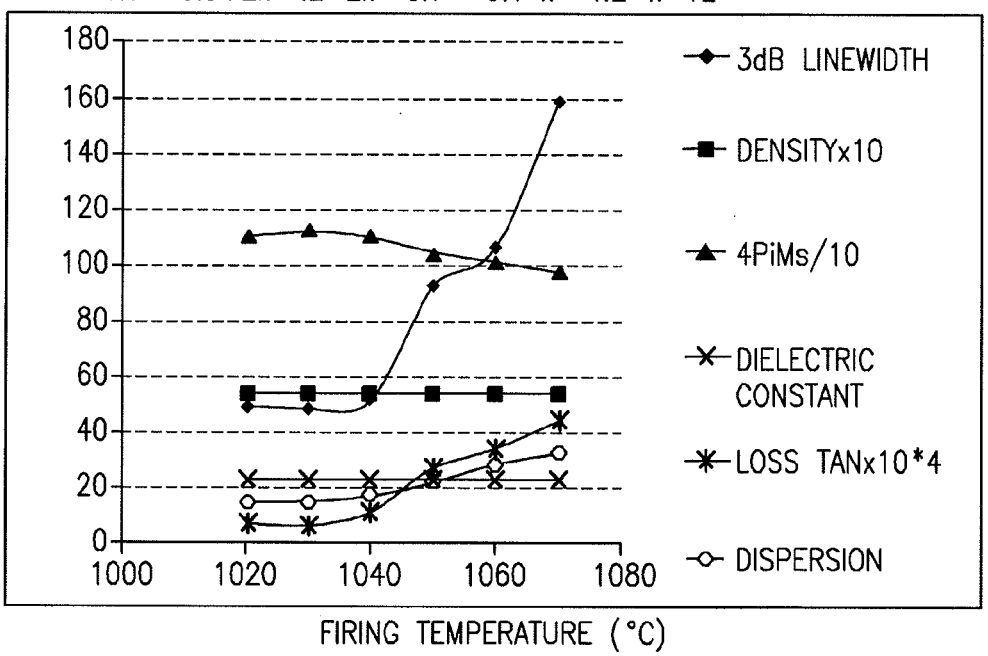
Figure 4E:
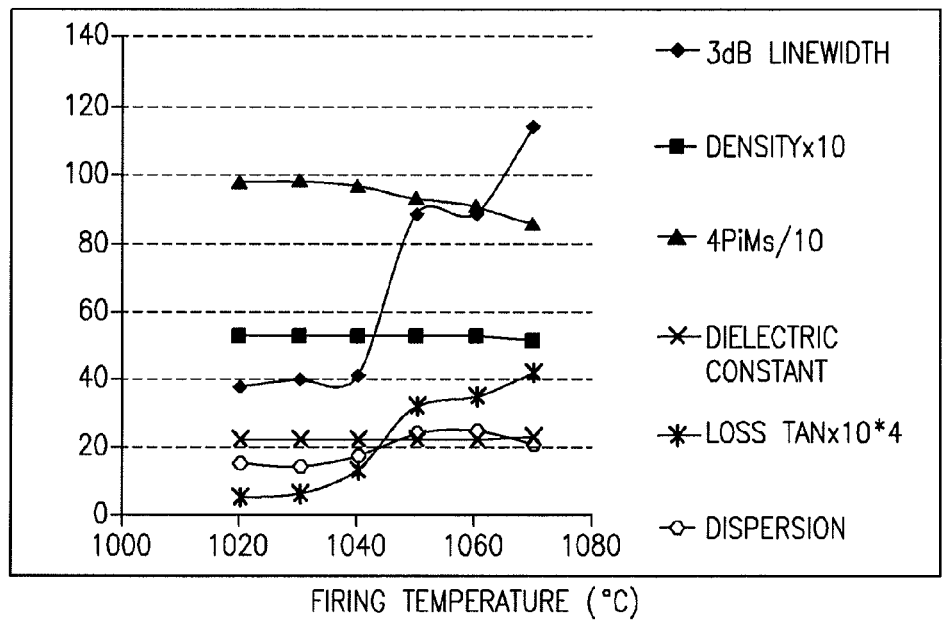
Figure 4F:
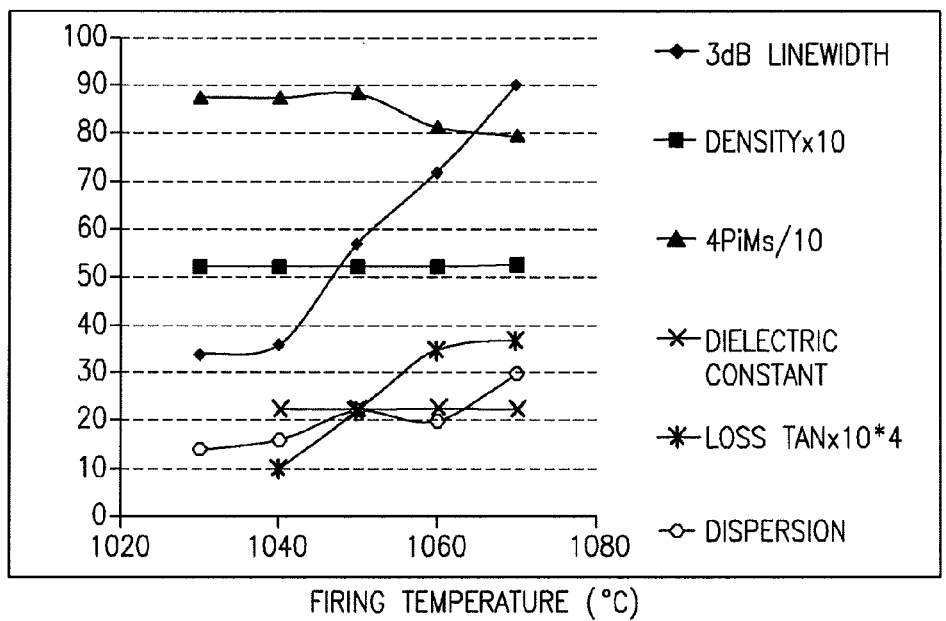
Figure 4G:
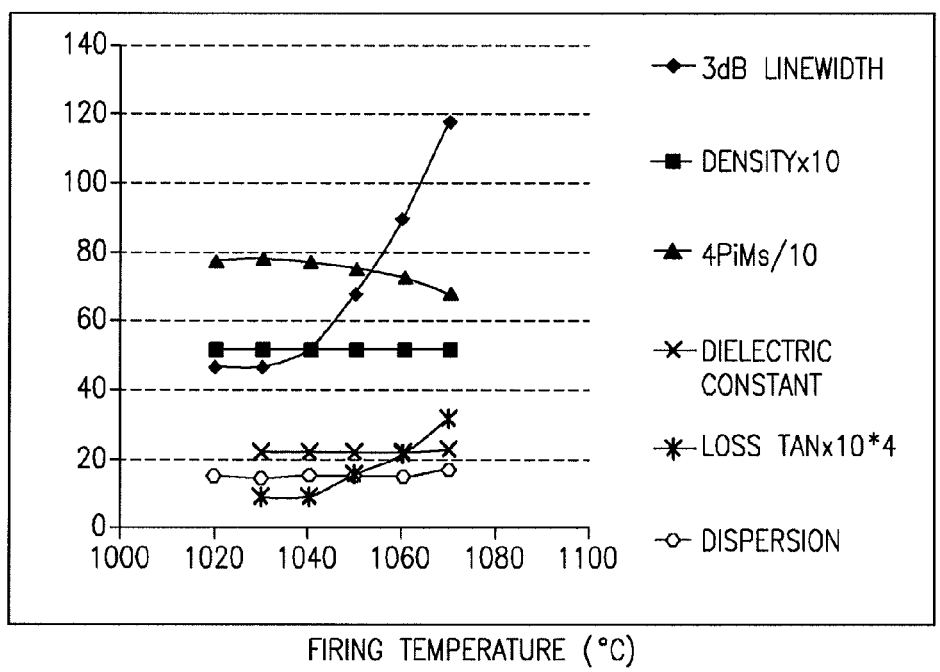

In another implementation, the modified synthetic garnet composition may be represented by Formula V: $Bi_{0.9}Ca_{0.9x}Y_{2.1-0.9x}(Zr_{0.7}Nb_{0.1})_xFe_{5-0.8x}O_{12}$, wherein x=0.5 to 1.0. In this implementation, the octahedral substitution is made with two high valency ions: $Zr^{4+}$ and $Nb^{5+}$ with Bi held constant at 0.9. FIG. 3 illustrates variations of material properties in connection with varying levels of (Zr, Nb). As shown in FIG. 3, the magnetic resonance linewidth decreased with higher octahedral substitutions. The magnetization also fell as the increase in total non-magnetic ions overcomes the higher non-magnetic octahedral substitutions.

Figure 5:
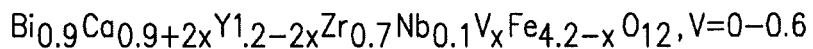
FIG. 5 is a graph depicting best linewidth versus composition of varying Vanadium content in crystalline compositions represented by the formula $Bi_{0.9}Ca_{0.9+2x}Zr_{0.7}Nb_{0.1}V_xFe_{4.2-x}O_{12}$ where x=0-0.6.
Figure 5:
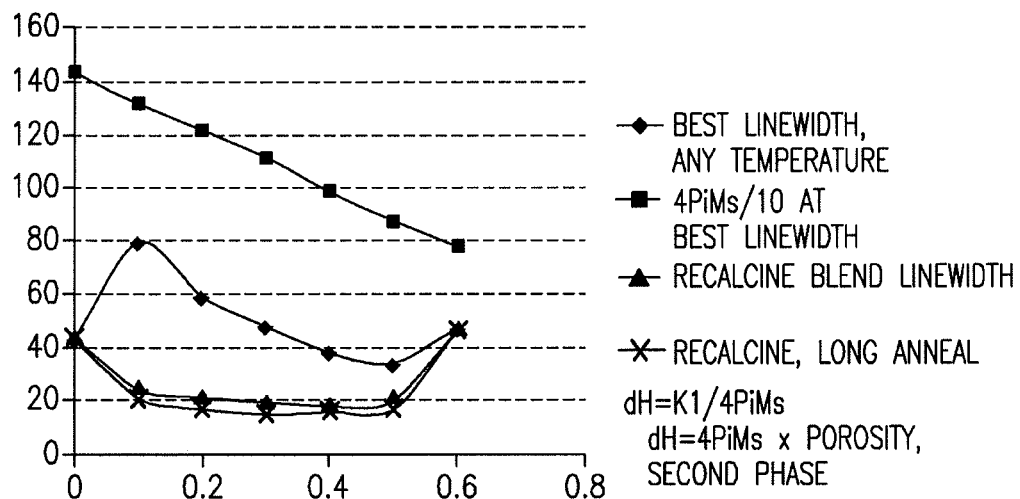

In another implementation, the modified synthetic garnet composition may be represented by Formula VI: $Bi_{0.9}Ca_{0.9+2x}Y_{2.1-0.9-2x}Zr_{0.7}Nb_{0.1}V_xFe_{4.2-x}O_{12}$, where V=0-0.6. In this implementation, Vanadium is introduced to the octahedral site in addition to Zr and Nb. When V=0.6, Y is completely replaced. FIGS. 4A-4G illustrate the relationship between firing temperatures and various material properties as V level increases from 0 to 0.6. As illustrated, the 3 dB linewidth, measured in accordance with ASTM A883/A883M-01, tends to remain below 50 Oe at all V levels at firing temperatures below 1040° C. FIG. 5 illustrates the best linewidth at varying firing temperatures versus composition at varying levels of V of one preferred embodiment. In some implementations, the linewidth can be further reduced by annealing the material. The effect of annealing on linewidth of $Bi_{0.9}Ca_{0.9+2x}Y_{2.1-0.9-2x}Zr_{0.7}Nb_{0.1}V_xFe_{4.2-x}O_{12}$, where x=0.1 to 0.5 is illustrated in Table 2 below.

(CaCO$_3$), Zirconium Oxide (ZrO$_2$), Vanadium Pentoxide (V$_2$O$_5$), Yttrium Vanadate (YVO$_4$), Bismuth Niobate (BiNbO$_4$), Silica (SiO$_2$), Niobium Pentoxide (Nb$_2$O$_5$), Antimony Oxide (Sb$_2$O$_3$), Molybdenum Oxide (MoO$_3$), Indium Oxide (In$_2$O$_3$), or combinations thereof. In one embodiment, raw material consisting essentially of about 35-40 wt % Bismuth Oxide, more preferably about 38.61 wt %; about 10-12 wt % Calcium Oxide, more preferably about 10.62 wt %; about 35-40 wt % Iron Oxide, more preferably about 37 wt %, Linewidth (Oer) and Curie Temperature (degrees C.) Data
$Bi_{0.9}Ca_{0.9+2x}Y_{2.1-0.9-2x}(Zr,Nb)_{0.8}V_xFe_{4.2-x}O_{12}$

| Formula | Heat Treatment (Initial Blend) | 3 dB before anneal | 3 dB after anneal | Heat Treatment (Calcined Blend) | 3 dB before anneal | 3 dB after anneal | Heat Treatment (Calcined Blend + Extended Milling) | 3 dB before anneal | 3 dB after extended anneal | Curie Temp |
|---|---|---|---|---|---|---|---|---|---|---|
| V = 0.5 | 1050 | 39 | 25 | 1030 | 38 | 20 | 1030 | 38 | 17 | 108 |
| V = 0.4 | 1050 | 44 | 27 | 1030 | 48 | 18 | 1030 | 42 | 16 | 112 |
| V = 0.3 | 1050 | 52 | 32 | 1030 | 46 | 19 | 1030 | 48 | 15 | 111 |
| V = 0.2 | 1050 | 59 | 43 | 1030 | 55 | 21 | 1030 | 62 | 17 | 108 |
| V = 0.1 | 1050 | 78 | 62 | 1030 | 61 | 24 | 1030 | 55 | 21 | 107 |

Figure 6:
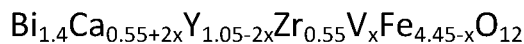
FIG. 6 is a graph illustrating the properties of crystal compositions represented by the formula $Bi_{1.4}Ca_{0.55+2x}Y_{1.05-2x}Zr_{0.55}V_xFe_{4.45-x}O_{12}$, where x=0-0.525.
Figure 6:
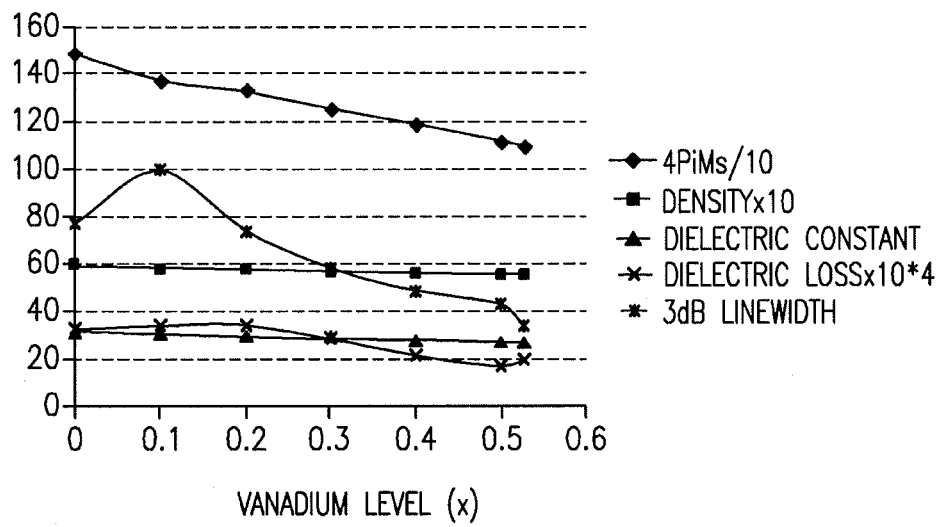

In another implementation, the modified synthetic garnet composition may be represented by Formula VI: $Bi_{1.4}Ca_{0.55+2x}Y_{1.05-2x}Zr_{0.55}V_xFe_{4.45-x}O_{12}$, where x= 0-0.525. In this implementation, the level of Bi doping is increased while the level of octahedral substitution is decreased. The material formed has higher Curie temperature and low linewidth. The Vanadium (V) content is varied from 0 to 0.525. When V=0.525, the composition is free of Yttrium. The resulting material achieved a linewidth of 20 Oe without subsequently heat treatment. FIG. 6 illustrates the properties of the material with varying amount of V. As shown in FIG. 6, V drops the dielectric constant rapidly, about 1 unit for each 0.1 of V in the formula unit, and drops the magnetization by about 80 Gauss for each 0.1 of V. Optimizing the processing parameters such as firing conditions have produced linewidth as low as 11 or V at or close to 0.525, which is free of Y. These values are comparable to commercially available Calcium Yttrium Zirconium Vanadium garnets of the same magnetization.

In another implementation, the modified synthetic garnet composition may be represented by Formula VII: $Y_2CaFe_{4.4}Zr_{0.4}Mo_{0.2}O_{12}$. In this implementation, high valency ion Molybdenum (Mo) is added to the tetrahedral site to create a single phase crystal. In other implementations, the modified synthetic garnet compositions can be represented by a formula selected from the group consisting of: $BiY_2Fe_{4.6}In_{0.4}O_{12}$, $BiCa_{0.4}Y_{1.6}Fe_{4.6}Zr_{0.4}O_{12}$, $BiCa_{0.4}Y_{1.6}Fe_{4.6}Ti_{0.4}O_{12}$, $BiCa_{0.8}Y_{1.2}Fe_{4.6}Sb_{0.4}O_{12}$, $BiY_2Fe_{4.6}Ga_{0.4}O_{12}$, $BiCa_{1.2}Y_{0.8}Fe_{4.2}In_{0.4}Mo_{0.4}O_{12}$, $BiY_{1.2}Ca_{0.8}Fe_{4.2}Zn_{0.4}Mo_{0.4}O_{12}$, $BiY_{1.2}Ca_{0.8}Fe_{4.2}Mg_{0.4}Mo_{0.4}O_{12}$, $BiY_{0.4}Ca_{1.6}Fe_{4.2}Zr_{0.4}Mo_{0.4}O_{12}$, $BiY_{0.4}Ca_{1.6}Fe_{4.2}Sn_{0.4}Mo_{0.4}O_{12}$, $BiCa_2Fe_{4.2}Ta_{0.4}Mo_{0.4}O_{12}$, $BiCa_2Fe_{4.2}Nb_{0.4}Mo_{0.4}O_{12}$, $BiY_{0.8}Ca_{1.2}Fe_{4.6}Mo_{0.4}O_{12}$, and $BiY_{0.4}Ca_{1.6}Fe_{4.2}Ti_{0.4}Mo_{0.4}O_{12}$.

Preparation of the Modified Synthetic Garnet Compositions

The preparation of the modified synthetic garnet materials can be accomplished by using known ceramic techniques. A particular example of the process flow is illustrated in FIG. 7.

Figure 7:
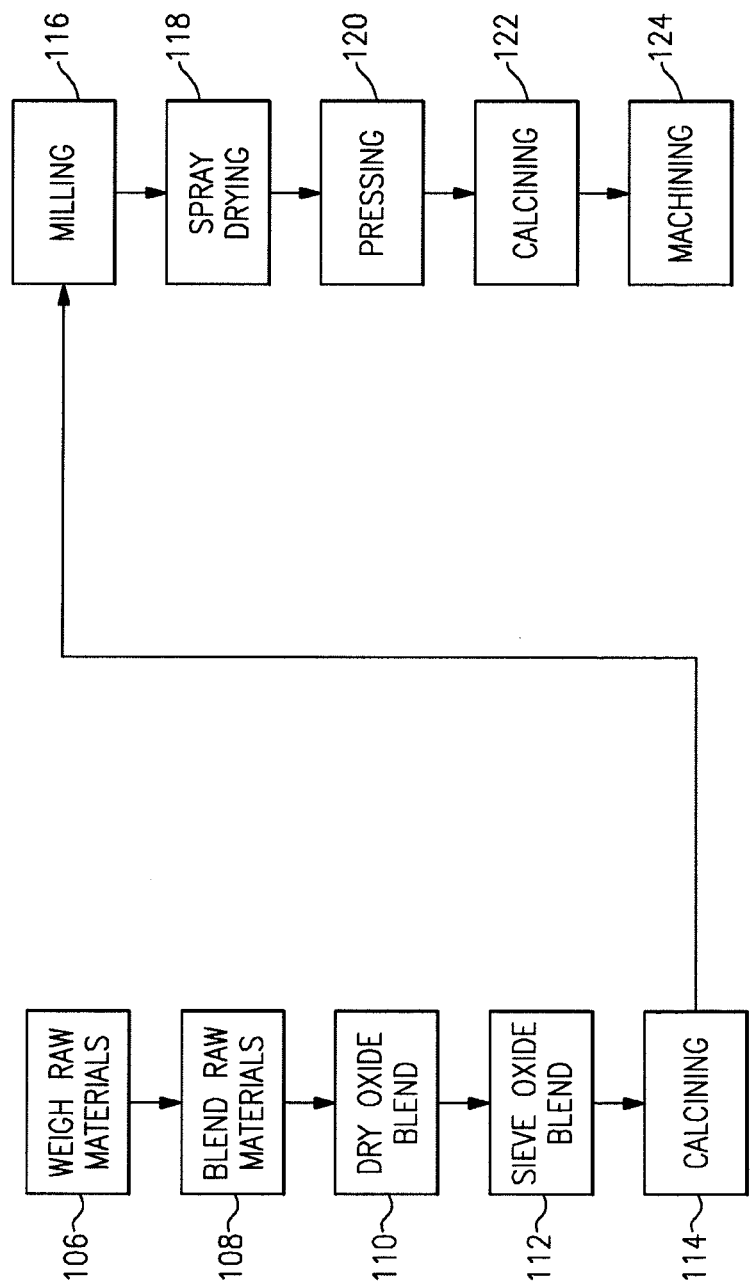
FIG. 7 illustrates a process flow for making a modified synthetic garnet of one preferred embodiment.

As shown in FIG. 7, the process begins with step 106 for weighing the raw material. The raw material may include oxides and carbonates such as Iron Oxide (Fe$_2$O$_3$), Bismuth Oxide (Bi$_2$O$_3$), Yttrium Oxide (Y$_2$O$_3$), Calcium Carbonate about 5-10 wt % Zirconium Oxide, more preferably about 8.02 wt %; about 4-6 wt % Vanadium Oxide, more preferably about 5.65 wt %. In addition, organic based materials may be used in a sol gel process for ethoxides and/or acrylates or citrate based techniques may be employed. Other known methods in the art such as co-precipitation of hydroxides may also be employed as a method to obtain the materials. The amount and selection of raw material depend on the specific formulation.

After the raw material is weighed, they are blended in Step 108 using methods consistent with the current state of the ceramic art, which can include aqueous blending using a mixing propeller, or aqueous blending using a vibratory mill with steel or zirconia media. In some embodiments, a glycine nitrate or spray pyrolysis technique may be used for blending and simultaneously reacting the raw materials.

The blended oxide is subsequently dried in Step 110, which can be accomplished by pouring the slurry into a pane and drying in an oven, preferably between 100-400° C. or by spray drying, or by other techniques known in the art.

The dried oxide blend is processed through a sieve in Step 112, which homogenizes the powder and breaks up soft agglomerates that may lead to dense particles after calcining.

The material is subsequently processed through a pre-sintering calcining in Step 114. Preferably, the material is loaded into a container such as an alumina or cordierite sagger and heat treated in the range of about 800-1000° C., more preferably about 900-950° C. Preferably, the firing temperature is low as higher firing temperatures have an adverse effect on linewidth.

After calcining, the material is milled in Step 116, preferably in a vibratory mill, an attrition mill, a jet mill or other standard comminution technique to reduce the median particle size into the range of about 0.5 micron to 10 microns. Milling is preferably done in a water based slurry but may also be done in ethyl alcohol or another organic based solvent.

The material is subsequently spray dried in Step 118. During the spray drying process, organic additives such as binders and plasticizers can be added to the slurry using techniques known in the art. The material is spray dried to provide granules amenable to pressing, preferably in the range of about 10 microns to 150 microns in size.

The spray dried granules are subsequently pressed in Step 120, preferably by uniaxial or isostatic pressing to achieve a pressed density to as close to 60% of the x-ray theoretical density as possible. In addition, other known methods such as tape casting, tape calendaring or extrusion may be employed as well to form the unfired body.

The pressed material is subsequently processed through a calcining process in Step 122. Preferably, the pressed material is placed on a setter plate made of material such as alumina which does not readily react with the garnet material. The setter plate is heated in a periodic kiln or a tunnel kiln in air or pressure oxygen in the range of between about 850° C.-1000° C. to obtain a dense ceramic compact. Other known treatment techniques such as induction heat may also be used in this step.

The dense ceramic compact is machined in the Step 124 to achieve dimensions suitable for the particular applications.

Devices and Systems Incorporating the Modified Synthetic Garnet Compositions

The modified synthetic garnet compositions made in accordance with the preferred embodiments in this disclosure can be utilized as a ferrite material in a number of different devices utilized in magnetic microwave applications, such as ferrite based isolators, circulators and resonators. Isolators and circulators are necessary in all cellular base stations to direct the RF energy and prevent the energy from flowing back and destroying circuit components. The modified synthetic garnet materials disclosed herein are designed to lower the magnetic resonance linewidth and raise the dielectric constant of the ferrite in circulators and isolators, thus allowing for desirable miniaturization of circulator components.

Figure 8:
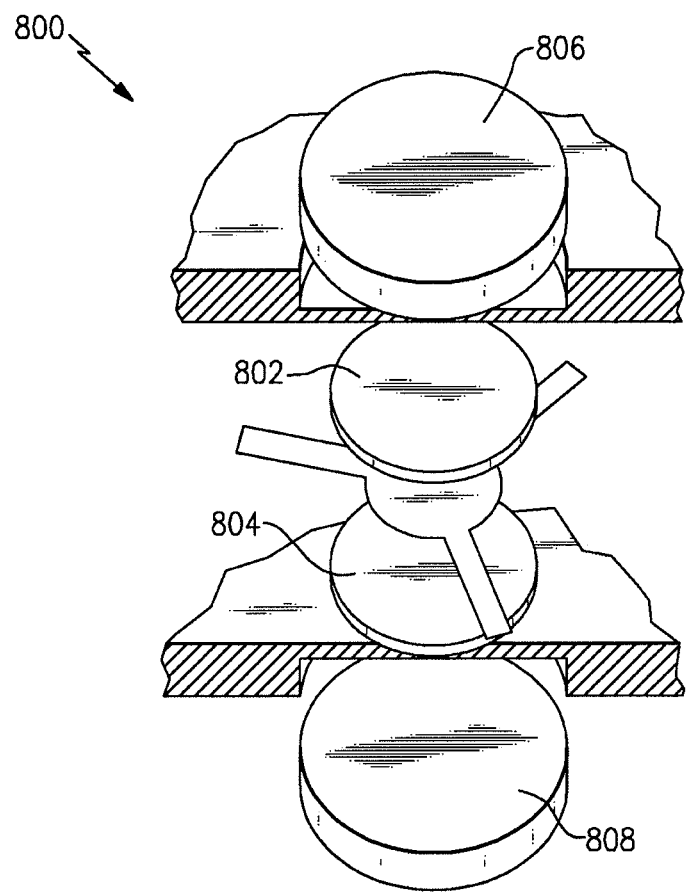
FIG. 8 is a schematic illustration of a circulator incorporating a modified synthetic garnet material of one preferred embodiment.

FIG. 8 schematically shows an example of a circulator 800 incorporating a modified synthetic garnet composition disclosed herein. As shown in FIG. 8, the circulator 800 has a pair of ferrite disks 802, 804 disposed between a pair of cylindrical magnets 806, 808. The ferrite disks 802, 804 are preferably made of modified synthetic garnet compositions whereby at least a portion of the Yttrium is replaced. In one embodiment, the composition can be represented by the formula $Bi_xCa_{y+2z}Y_{3-x-y-2z}Fe_{5-y-z}Zr_yV_zO_{12}$, wherein x is greater than or equal to 0.5 and less than or equal to 1.4; y is greater than or equal to 0.3 and less than or equal to 0.55; and z is greater than or equal to 0 and less than or equal to 0.6. The magnets 806, 808 can be arranged so as to yield generally axial field lines through the ferrite disks. Preferably, the ferrite disks have a magnetic resonance linewidth of 11 Oe or less.

Figure 9:
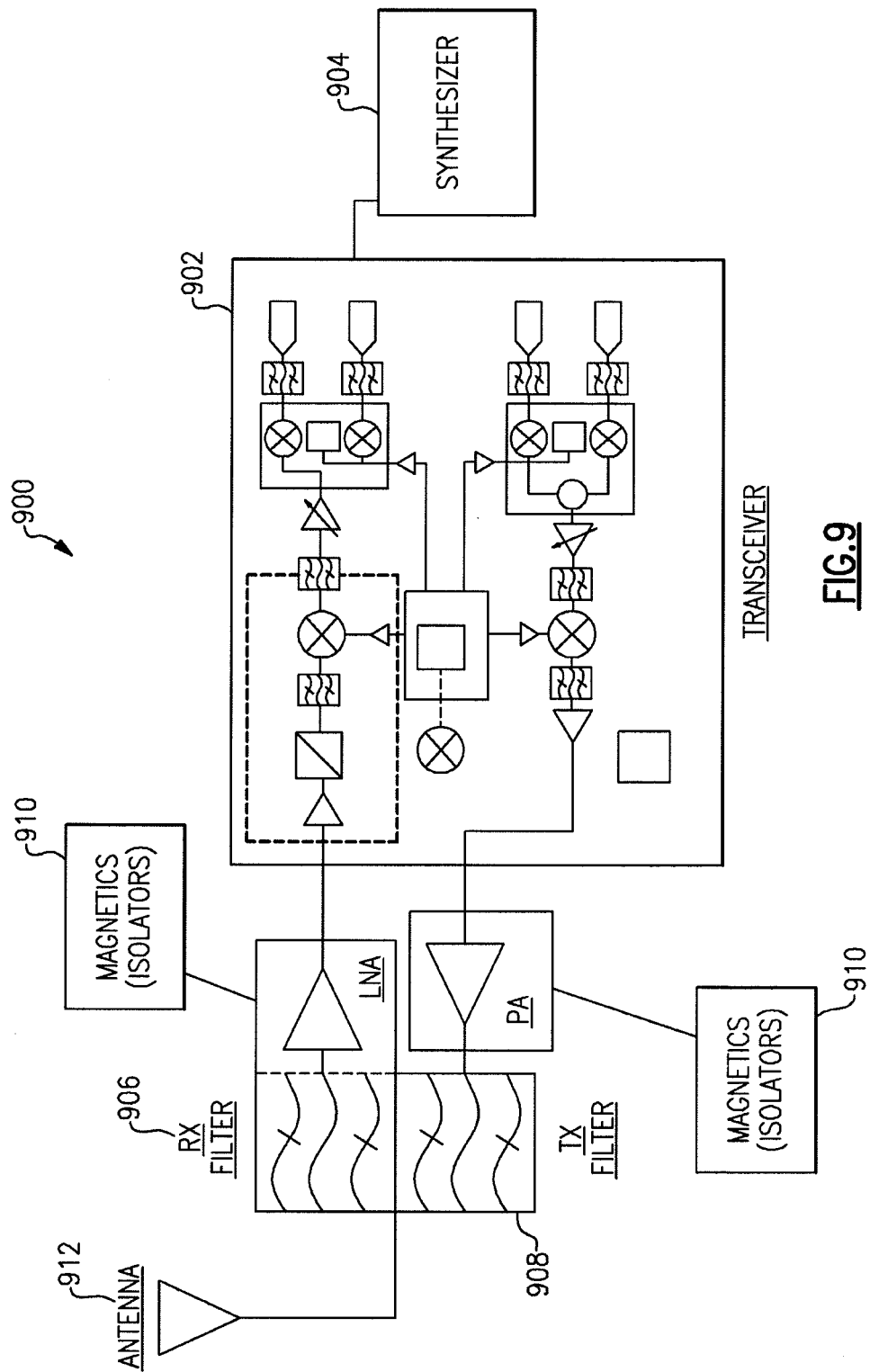
FIG. 9 is a schematic illustration of a telecommunication system incorporating the isolator of FIG. 8.

FIG. 9 illustrates a telecommunication base station system 900 comprising a transceiver 902, a synthesizer 904, an RX filter 906, a TX filter 908, and magnetic isolators 910 and an antenna 912. The magnetic isolators 910 can be incorporated in a single channel PA and connectorized, integrated triplate or microstrip drop-in. In preferred implementations, the magnetic isolators 910 comprise a modified synthetic garnet material having at least some of the Yttrium substituted in accordance with certain embodiments described in this disclosure and having magnetic properties equivalent to conventional synthetic garnets.

While certain embodiments of the inventions have been described, these embodiments have been presented by way of example only, and are not intended to limit the scope of the disclosure. Indeed, the novel compositions, methods and systems described herein may be embodied in a variety of other forms; furthermore, various omissions, substitutions and changes in the form of the compositions, methods and systems described herein may be made without departing from the spirit of the disclosure. The accompanying claims and their equivalents are intended to cover such forms or modifications as would fall within the scope and spirit of the disclosure.

What is claimed is:

1. A modified garnet structure having a composition represented by the formula
$Bi(Y,Ca)_2Fe_{4.2}M^I_{0.4}M^{II}_{0.4}O_{12}$, wherein $M^I$ is on the octahedral site of the garnet and can be selected from the group consisting of In, Zn, Mg, Zr, Sn, Ta, Nb, Fe, Ti, Sb, and combinations thereof, wherein $M^{II}$ is on the tetrahedral site of the garnet and can be selected from the group consisting of: Ga, W, Mo, Ge, V, Si, and combinations thereof.

2. A microwave device incorporating a modified garnet structure having a composition represented by the formula:
$Bi(Y,Ca)_2Fe_{4.2}M^I_{0.4}M^{II}_{0.4}O_{12}$, wherein MI is on the octahedral site of the garnet and can be selected from the group consisting of In, Zn, Mg, Zr, Sn, Ta, Nb, Fe, Ti, Sb, and combinations thereof, wherein MII is on the tetrahedral site of the garnet and can be selected from the group consisting of: Ga, W, Mo, Ge, V, Si, and combinations thereof.

3. The microwave device of claim 2 wherein the device is an isolator.

4. The microwave device of claim 2 wherein the device is a circulator.

5. The microwave device of claim 2 wherein the device is a resonator.

6. The microwave device of claim 4 wherein the circulator comprises a pair of ferrite disks from the modified garnet structure.

7. A method of forming a modified garnet structure comprising:
   providing a material comprising oxides, carbonates, or a combination thereof;
   blending the material to form a mixture;
   drying the mixture at a temperature between 100-400° C.;
   sieving the dried mixture;
   calcining the sieved mixture at a temperature between 800-1000° C.;
   milling the calcined material into particles sizes of about 0.5 micron to 10 microns;
   spray drying the milled material to form granules;
   pressing the granules; and
   calcining the pressed granules at a temperature between about 850-1000° C. to form a composition represented by the formula:
   $Bi(Y,Ca)_2Fe_{4.2}M^I_{0.4}M^{II}_{0.4}O_{12}$, wherein MI is on the octahedral site of the garnet and can be selected from the group consisting of In, Zn, Mg, Zr, Sn, Ta, Nb, Fe, Ti, Sb, and combinations thereof, wherein MII is on the tetrahedral site of the garnet and can be selected from the group consisting of: Ga, W, Mo, Ge, V, Si, and combinations thereof.

8. The method of claim 7 wherein calcining the milled material is at a temperature between about 900-950° C.

9. The method of claim 7 wherein milling is performed in a vibratory mill, an attrition mill, or a jet mill.

10. The method of claim 7 wherein the pressed material has a density of around 60% prior to calcining the milled material.

\* \* \* \* \*